United States Patent [19]

Lim

[11] Patent Number: 4,491,860

[45] Date of Patent: Jan. 1, 1985

[54] TIW$_2$N FUSIBLE LINKS IN SEMICONDUCTOR INTEGRATED CIRCUITS

[75] Inventor: Sheldon C. P. Lim, Sunnyvale, Calif.

[73] Assignee: Signetics Corporation, Sunnyvale, Calif.

[21] Appl. No.: 371,147

[22] Filed: Apr. 23, 1982

[51] Int. Cl.$^3$ .................. H01L 21/479; H01L 21/70; H01L 21/94; H01L 23/54

[52] U.S. Cl. ........................................ 357/68; 357/71; 357/51; 357/67; 357/23 C; 365/96; 365/103; 365/104

[58] Field of Search ...................... 357/51, 67, 65, 71, 357/23 C; 365/96, 103, 104

[56] References Cited

U.S. PATENT DOCUMENTS

Re. 28,481  7/1975  Shields et al. .......................... 29/577
4,179,533 12/1979  Christou et al. ....................... 357/71

OTHER PUBLICATIONS

"High-Temperature Contact Structures for Silicon Semiconductor Devices", Author: Wittmer-Appl. Phys. Lett. 37(6), Sep. 15, 1980, American Institute of Physics, pp. 540–542.

*Magnetron Sputtered Titanium–Tungsten Films,* by M. Hill, Solid State Technology, Jan. 1980, pp. 53–59.
*Simple Process Propels Bipolar Proms to 16K Density and Beyond,* by R. K. Wallace and A. J. Learn, Electronics, Mar. 27, 1980, pp. 147–150.
*Corrosion Resistance of Several Integrated Circuit Metallization Schemes,* by J. A. Cunningham, C. R. Fuller C. T. Haywood, IEEE Transactions Rel, vol. 19, 1970, pp. 182–187.
*Application of Titanium–Tungsten Barrier Metallization For Integrated Circuits,* by P. B. Ghate, J. C. Blair, C. R. Fuller and G. E. McGuire, Thin Solid Films, vol. 53, 1978, pp. 117–128.
*Studies of the Ti–W/Au Metallization on Aluminum,* by R. S. Nowicki, J. M. Harris, M. A. Nicolet and I. V. Mitchell, Thin Solid Films, vol. 53, 1978, pp. 195–205.

*Primary Examiner*—Andrew J. James
*Assistant Examiner*—S. V. Clark
*Attorney, Agent, or Firm*—J. A. Dinardo; R. J. Meetin; T. A. Briody

[57] ABSTRACT

A film of titanitum-tungsten nitride is used to provide the dual function of a fuse link between a semiconductive device and an interconnect line in a memory array and of a barrier metal between another metal and a semiconductor region.

11 Claims, 11 Drawing Figures

TIW₂N FUSIBLE LINKS IN SEMICONDUCTOR INTEGRATED CIRCUITS

BACKGROUND OF THE INVENTION

This invention relates to semiconductor integrated circuit devices employing fusible links, such as memories, and more particularly to device structures which also employ a metallic layer which serves to prevent diffusion of a contact metal, such as aluminum, into the semiconductor region where electrical contact is made, such as a shallow emitter region.

Bipolar memory PROMS are turning toward washed emitter processing as the devices become more dense and complex. The present metallization scheme of nichrome fusible links with dual layer aluminum is not compatible with these shallow N+/P junctions due to the interdiffusion of aluminum silicon. Yet, pure aluminum is needed for Schottky diodes. The past approach to solve this problem has been the addition of an aluminum diffusion barrier, such as titanium-tungsten, Ti:W, to the existing metallization scheme. See for example a paper by J. A. Cunningham, C. R. Fuller, and C. T. Haywood, entitled "Corrosion Resistance of Several Integrated Circuit Metallization Schemes", published in IEEE Transactions Rel, Vol. 19, 1970, pp 182–187, and the paper by P. B. Ghate, J. C. Blair, C. R. Fuller and G. E. McGuire, entitled "Application of Titanium-Tungsten Barrier Metallization For Integrated Circuits", published in Thin Solid Films, Vol. 53, 1978, pp 117–128. While this approach should be workable, in practice it presents process problems due to the ready oxidation of both titanium-tungsten and nichrome upon exposure to air, resist processing, acids, as well as making the metallization a more intricate and expensive process.

While there has been some attempt by others to use titanium-tungsten for both fusible link and diffusion barrier purposes, this approach has not proven entirely satisfactory because of the relatively high thickness of titanium-tungsten films required to serve as an effective barrier layer. The resulting thick fuse requires that higher current is needed to fuse satisfactorily. The higher current imposes the need for larger transistors and thicker or wider aluminum interconnects.

A paper by R. R. Nowicki, J. M. Harris, M. A. Nicolet and I. V. Mitchell entitled "Studies of the Ti—W/Au Metallization on Aluminum", published in Thin Solid Films, Vol. 53, 1978, pp 195–205 discloses that nitrided titanium-tungsten is a better diffusion barrier than pure titanium-tungsten when placed between aluminum on silicon and gold. A paper by M. Hill entitled "Magnetron Sputtered Titanium-Tungsten Films", published in Solid State Technology, January 1980, pp 53–59, discloses conventional diffusion barrier structures of titanium-tungsten on silicon followed by aluminum on titanium-tungsten. This paper also discloses the use of oxygen and nitrogen to control the resistivity of titanium-tungsten barrier film.

However, both the paper by Hill and the paper by Nowicki deal solely with the use of titanium-tungsten nitride as a barrier metal layer and there is no suggestion that it would have any special advantages as a fuse material.

SUMMARY OF THE INVENTION

This invention is predicated in part on the realization that a metal film of titanium-tungsten-nitride can be formed in such a small thickness that it not only retains its effectiveness as a metal diffusion barrier layer, but also has such thickness that it can also serve as a highly effective fuse link in memory structures or the like.

According to an aspect of the invention, a semiconductor body having a surface and a layer of insulating material over the surface provides support for a matrix of rows and columns of conductors. An array of memory elements is connected between the conductors, each memory element including a semiconductive device formed in the semiconductor body and a fusible link carried by the insulating layer. The fusible link and the semiconductor device are connected in series between a row and a column conductor. There is at least one other semiconductor device not forming a part of the memory array which is provided with a surface contact region in the semiconductor body. A plural metal layer structure is formed to make electrical contact with the surface contact region. One of the metal layers of the structure serves as a barrier layer between the surface contact region and another of the plural metal layers. Both the one metal layer and the fusible link are formed from titanium-tungsten-nitride film.

DESCRIPTION OF THE PREFERRED EMBODIMENT

Figure 1:
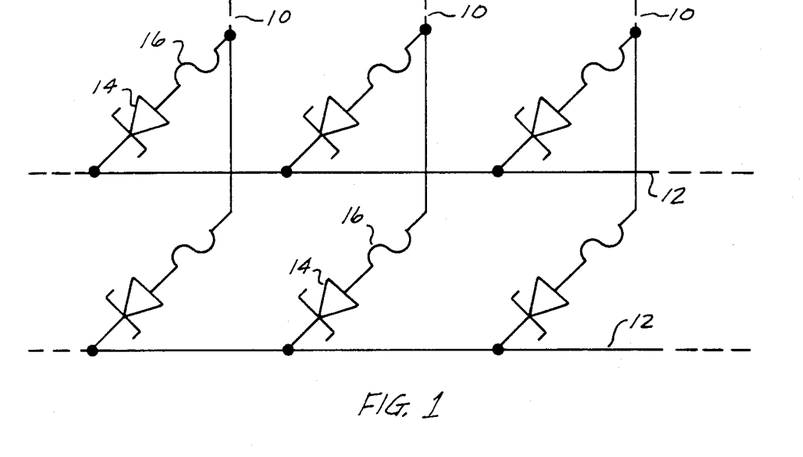
FIG. 1 is a schematic diagram of a bipolar memory array in which each of the memory elements comprises a Schottky diode connected in series with a fusible link between a bit line and a word line.

In the schematic diagram of FIG. 1 there is shown a Schottky diode memory array in which a plurality of bit lines 10 are arranged in columns and a plurality of word lines 12 are arranged in rows. At each crossover of a word line 12 and a bit line 10, there is a Schottky diode 14 and a fuse link 16 serially connected between a work line 12 and a bit line 10. When a potential difference is applied between a word line 12 and a bit line 10 so as to forward bias the Schottky diode 14 connected therebetween, an electrical sensing current will flow between the two selected lines 10 and 12, provided the fuse link 16 is intact. To program a given element, a high potential difference can be applied which will provide sufficient current to blow the fuse link 16 and thus open the series circuit between a selected pair of lines 10 and 12. Then, when a sensing voltage is applied between the two lines 10 and 12 no current will flow. The presence of sensing current can indicate one state, such as a one (1), and the absence of sensing current can indicate the other state such as a zero (0).

Another version of a memory array is one in which the Schottky diode is replaced by a semiconductive junction diode such as a base-collector diode. A version of this type of a memory element is disclosed in U.S. Pat. No. Re. 28,481 to Shields et al, reissued July 15, 1975. Other types of memory arrays are disclosed in a paper by R. K. Wallace and A. J. Learn, entitled "Simple Process Propels Bipolar Proms to 16K Density and Beyond", Electronics, Mar. 27, 1980, pp 147–150.

Reference is now made to FIGS. 2 through 11 which show the steps in fabricating a memory array and transistor structure according to the invention. The memory array with Schottky diode and fuse structure appears in the lefthand portion of the figures and a washed emitter transistor structure incorporating a barrier layer appears in the righthand portion of the figures. In a semiconductor chip the memory array usually occupies the major central area of the chip and the transistor is a part of the peripheral circuitry which surrounds one or more sides of the memory array. They are shown side-by-side because the same processing steps are used to fabricate both structures simultaneously.

Figure 2:
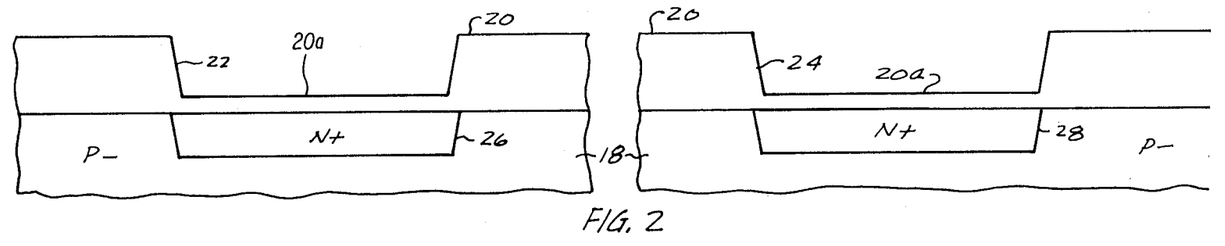
FIGS. 2 through 10 are cross sectional views showing the various process steps for fabricating an integrated circuit memory array and transistor structure incorporating the metal film composition according to the invention.

The fabrication process shown in FIG. 2 starts with furnishing a P-type substrate 18 of silicon, lightly doped to have about 7–21 ohm centimeters of resistivity and a crystal axis orientation of 111. On the surface of the silicon substrate 18 a thick oxide layer 20 is grown to a thickness of 1.0 micrometers or more depending upon the doping source to be used in forming the buried layer in the next step. Openings 22 and 24 are formed in the oxide layer 20 by photolithographic means to delineate the regions where two N-type diffusions 26 and 28 are next made. The dopant for the N+ diffusions may be arsenic, for example. The N+ diffusion 26 for the fuse link and Schottky diode structure provides a buried layer for the purpose of reducing the resistance of the cathode path of the Schottky diode, and the other N+ diffusion 28 provides a buried layer collector for the peripheral transistor. During the N+ diffusion, a small thickness 20a of oxide is shown formed over the N+ diffusion areas. The N+ diffusions 26 and 28 have a sheet resistance of about 20 ohms per square and a junction depth of about 3–4 micrometers.

Figure 3:
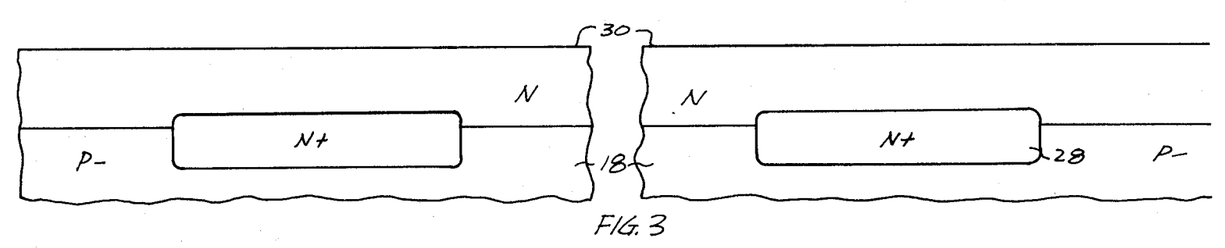

The oxide layers 20 and 20a are then removed in order to form an epitaxial layer 30 of N-type silicon, shown in FIG. 3. Prior to the epitaxial deposition and growth, an in situ hydrochloric etch is performed in order to ensure a clean surface on the substrate 18. The epitaxial layer 30 is doped with arsenic to about 0.45 ohm-cm. resistivity and is between 3 to 3.5 micrometers thick. During growth of the epitaxial layer 30, a portion of the buried layers 26 and 28 diffuses upwardly into the epitaxial layer 30 and the lower portion diffuses deeper into the substrate 18.

Figure 4:
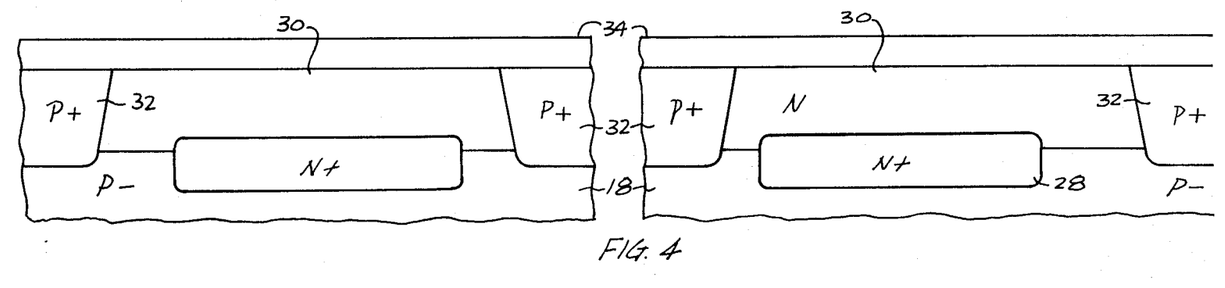

The next step is to form isolation regions for the memory elements and the peripheral transistor. A relatively thick oxide layer of 0.5 to 1.0 micrometer is grown along the entire upper surface of the epitaxial layer 30, after which it is masked with photoresist to provide openings in the oxide for diffusion of a P-type dopant, such as boron, to produce the isolation regions 32. The isolation regions 32 go deeply through the epitaxial layer 30 and into the substrate 18, as shown in FIG. 4. During the diffusion, an oxide is formed over the isolation regions. This oxide can be left on or it can be removed and a new oxide can be grown.

Figure 5:
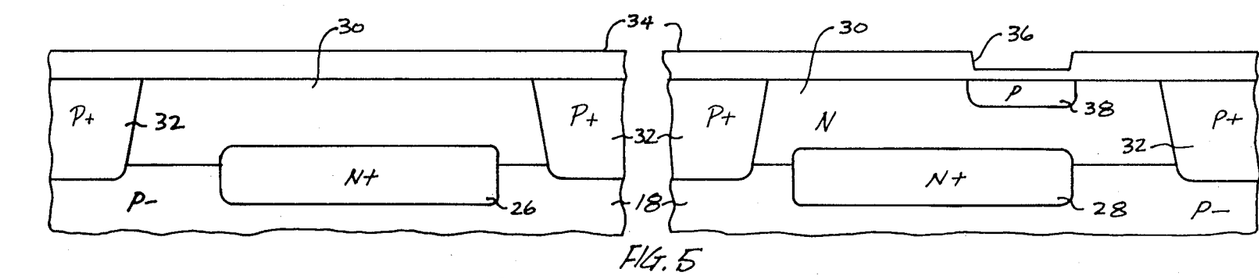

An optional step at this stage is to form a collector plug extending from the top of the epitaxial region 30 down to the N+ buried layer 28 in the transistor structure. This may be done by masking, etching, and then diffusing an N+ type dopant to a depth sufficient to contact the N+ buried layer region 28. The collector plug diffusion provides better conductivity between the collector contact to be formed at the surface of the epitaxial layer and the collector-base junction region. A surface oxide is formed during or after the collector plug diffusion. Prior to the next step an oxide layer 34 (resulting from the operations described here and in the preceding paragraph) will be present over the epitaxial layer 30 covering the isolation regions 32, as shown in FIGS. 4 and 5.

The next step is to form an opening 36 in the oxide layer 34 by masking and etching, and to diffuse a P-type dopant, such as boron, through the opening 36 to produce a base region 38 for the transistor. The sheet resistance of the base region 38 may be approximately 200 ohms/sq., and the junction depth approximately 1.0 micrometer. During the base diffusion, a thin oxide film is formed over the base region 38.

Figure 6:
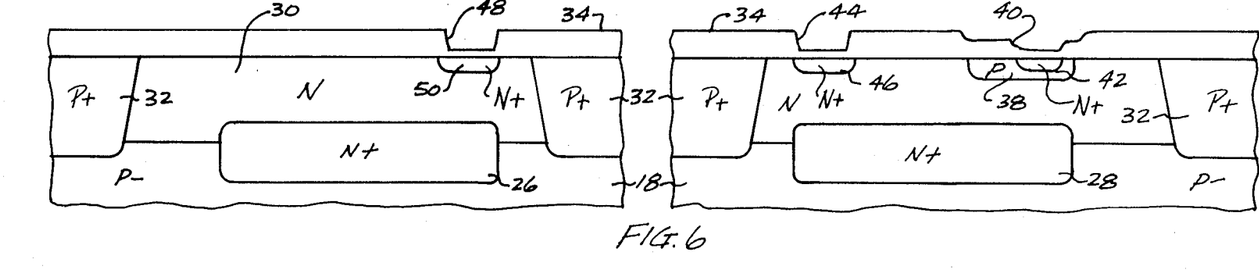

The next step is shown in FIG. 6, which is to form a series of openings in the oxide layer 34 through which a heavy dosage of an N-type dopant such as phosphorus or arsenic can be diffused. An opening 40 is provided over the base region 38 for diffusion of an N+ emitter region 42. A second opening 44 is provided to one side of the base region 38 for diffusion of an N+ collector contact region 46. A third opening 48 is provided for diffusion of an N+ cathode contact region 50 for the Schottky diode of the memory element.

Figure 7:
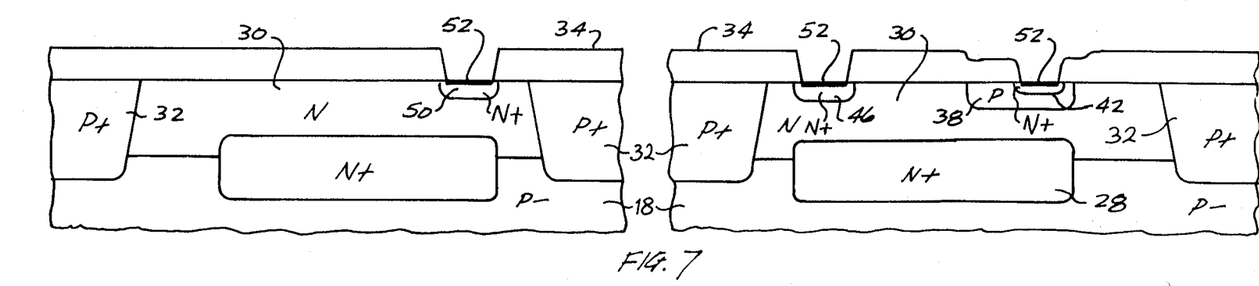

During the N+ diffusion very little oxide, about 400 angstroms, is formed over these N+ regions, since the emitter dimensions are very small, for example, such as 6 micrometers by 8 micrometers and 0.7 micrometers in depth. Subsequent contact openings cannot be placed inside the emitter by conventional photolithography. Rather, contact openings to the base and to the N-type epitaxial areas which will become Schottky diodes are made, after which the small amount of oxide over the emitter can be removed by placing the entire wafer in a hydrofluoric acid solution for a relatively short time, such as 30 seconds, without appreciably affecting the thicker oxide elsewhere. This is called emitter wash. The emitter wash may be done before the contact masking step is performed to provide contacts to the base and the epitaxial layer, as shown in FIG. 7, or it can be done after the contact mask step.

The next step involves the formation of a layer of metal silicide in some or all contact regions by depositing a metal such as platinum, palladium, or platinum-nickel, for example, and then alloying with the silicon. This can be done for example (a) between the emitter wash and the subsequent base/Schottky diode (both memory element and clamp) contact mask to form silicide in the emitter and N+ contacts only, as shown in FIG. 7. Alternatively, it may be done (b) between base/Schottky diode contact mask and the subsequent emitter wash to form silicide base contacts and silicide Schottky diodes. If done (c) after all contact masking, then all contacts will have silicide. The choice of any of these options (a), (b), or (c) depends primarily on the choice of Schottky diodes. If a silicide Schottky diode is desired then option (b) or (c) is chosen. If aluminum Scottky diodes are desired option (a) is chosen, along with the choice of not having silicide in the emitter. However, it is usually advantageous to have silicide wherever possible, in order to reduce or minimize contact resistance of a barrier metal to silicon as will be seen. In FIG. 7, silicide contacts 52 are shown deposited on the emitter region 42, on the collector contact region 46, and on the cathode contact region 50, through openings in the oxide layer 34. A typical composition for the silicide contacts 52 is one that is formed from 88% nickel and 12% platinum and which when alloyed with the silicon forms a ternary alloy of 50% silicon, 44% nickel and 6% platinum. Reference is made to U.S. Pat. No. 3,855,612 to Rosvold for a further teaching of platinel silicide contacts.

Figure 8:
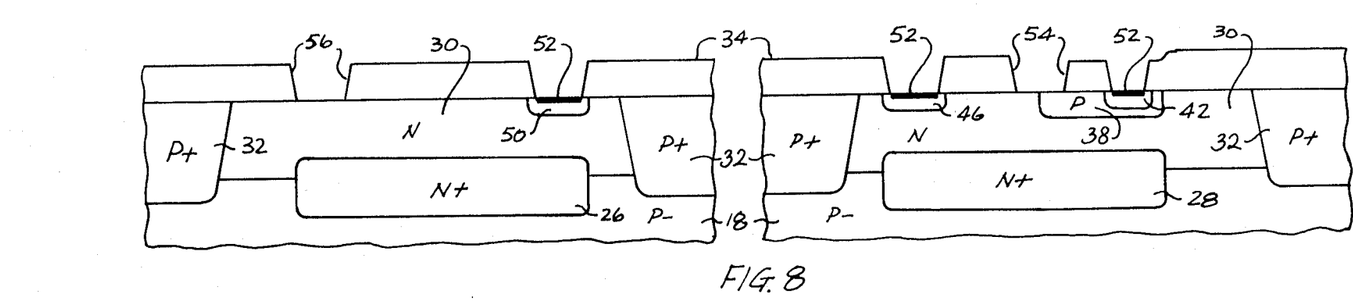

The next step is shown in FIG. 8, where openings 54 and 56 are formed in the oxide layer 34. One opening 54 is provided over the base region 38 exposing the junction between the base region 38 and the epitaxial layer 30. The other opening 56 is provided over the buried layer 26 exposing the epitaxial layer 30 in the memory element region.

Deposition of titanium-tungsten-nitride is now performed over the entire upper surface of the structure to act as a barrier metal to prevent aluminum penetration into the shallow emitters and to preserve the stability of the silicide Schottky barrier diodes, if used, and also to act as the fusible link. The composition of the film is approximately $TiW_2N$. It is reactively d.c. sputtered from a target of composition which is 30 atomic percent titanium, 70 atomic percent tungsten, at a partial pressure of nitrogen of $2.5 \times 10^{-4}$ torr and total argon plus nitrogen pressure of $1.5 \times 10^{-3}$ torr. The deposition rate is about 90 angstroms/min. The film resistivity is about 270 micro ohm-centimeters. The total pressure may be higher or lower, if the relative amount of nitrogen is raised or lowered accordingly. The titanium-tungsten-nitride film has been found to be a face-centered cubic (FCC) structure, in contrast to titanium-tungsten which is body-centered cubic (BCC). In a BCC crystal lattice structure, the atoms are located at each corner of a cube with one atom in the middle of the interior. In a FCC crystal lattice structure, the atoms are located at each corner of a cube, with one atom in the middle of each face. The closer packing of the atoms may account for its improved barrier metal properties over titanium-tungsten. Because it is a better barrier metal, the thickness of the film need not be as thick as titanium-tungsten for the same barrier effectiveness. Hence, a thinner film could be used. This is advantageous for a fuse material because the current density, which determines the ease of fusing, is thereby increased.

For example, a 600 angstrom film of titanium-tungsten-nitride is about equivalent to 1000 angstroms of titanium-tungsten in barrier effectiveness. For the same lateral width dimensions of the fusible link, and assuming the available current for fusing is 50 milliamperes, the current density of the titanium-tungsten film is 50 divided by 1,000 W while the titanium-tungsten nitride current density is 50 divided by 600 W, where W is the width, or an increase of two thirds or 66.7% over the titanium-tungsten current density. It is seen that in order to match the current density of the titanium-tungsten-nitride fuse, the current through a titanium-tungsten fuse would have to be increased to 50 milliamperes times one and two thirds which equals 83 milliamperes. This would require larger transistors and wider or thicker interconnects in order to handle the increased current. This in turn means that the die size would have to be increased so that fewer dice could be manufactured per wafer. Viewed in different terms, it is seen that with titanium-tungsten-nitride films, die size could be decreased relative to the use of titanium-tungsten films. The use of titanium-tungsten as a barrier metal and another thinner material as the fuse requires more processing and expense.

Following the deposition of the titanium-tungsten nitride film it is masked, preferably with a positive photoresist because of its better adhesion compared with negative photoresist. The terms positive photoresist and negative photoresist are well known to practitioners of the art. Etching is performed in 30% hydrogen peroxide to remove the titanium-tungsten-nitride film from unwanted areas, leaving the $TiW_2N$ fuse links and the $TiW_2N$ barrier metal caps over the shallow emitter 42 and the collector contact region 46. The fuse link is shown at 58a, the emitter cap is shown at 58b and the collector contact cap is shown at 58c in FIG. 9. If negative photoresist is used, it is necessary to use a thin aluminum coating of 500–1,000 angstroms deposited after the deposition of the $TiW_2N$ film to (a) prevent loss of adhesion of negative photoresist which otherwise occurs during $TiW_2N$ etching and (b) to protect the surface of the $TiW_2N$ film from the negative photoresist processing which otherwise is more likely than positive photoresist to result in contact resistance between the aluminum deposited later for interconnects and the $TiW_2N$. Obviously, this aluminum coating could also be used in conjunction with positive photoresist. If used, etching of aluminum is done first, so that it in turn is the mask for the $TiW_2N$ etching. Hence, loss of adhesion of photoresist during $TiW_2N$ etching is not of great concern. Following removal of photoresist, an in-situ sputter etch before deposition of the aluminum film used for interconnects is required to ensure good electrical contact between the metals. The aluminum coating will be removed from the fuse body during the etching to determine the aluminum interconnects, as is further described later.

Figure 9:
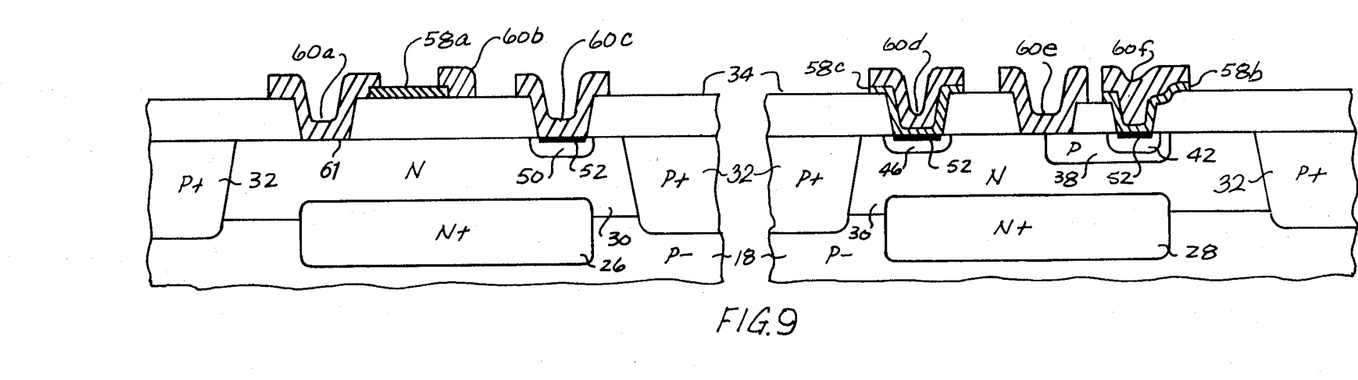

Following the definition of the titanium-tungsten-nitride approximately 0.7 micrometer of aluminum is deposited, masked, and then etched to form interconnects and Schottky barrier diodes. This bottom aluminum layer is shown at 60a forming a Schottky barrier contact with the epitaxial layer 30 at a region 61 and an ohmic contact with the fuse link 58a; at 60b forming a column line contracting the fuse link 58a; at 60c forming an ohmic contact with the cathode side of the foregoing Schottky barrier diode and serving as a contact for the row line to be deposited; at 60d forming a collector contact; at 60e forming an ohmic contact to the base region 38 and a Scottky barrier contact to the epitaxial layer 30; and at 60f forming an emitter contact.

In order to minimize voltage drops and to decrease the die size, it is advantageous to employ a second layer of aluminum metallization as the word lines. Hence, a glass layer, 62 doped with phosphorous to prevent cracking, is deposited to a thickness of about 1.0 micrometers, and masked and etched to form openings (or vias) 63. The second layer of aluminum is then deposited over the glass to a thickness of about 1.5 to 2.0 micrometers, and then masked and etched. The second aluminum layer is shown at 64 in FIG. 10. Finally, a top layer of glass to serve as a passivation layer is deposited over the entire structure. This top layer of glass is not shown in the drawing.

Both the intermediate glass layer and the top glass layer may be deposited from the reaction of oxygen and silane gas at substantially 400–450° C. Phosphorus doping of the glass is accomplished by injecting phosphine gas during glass deposition.

Figure 10:
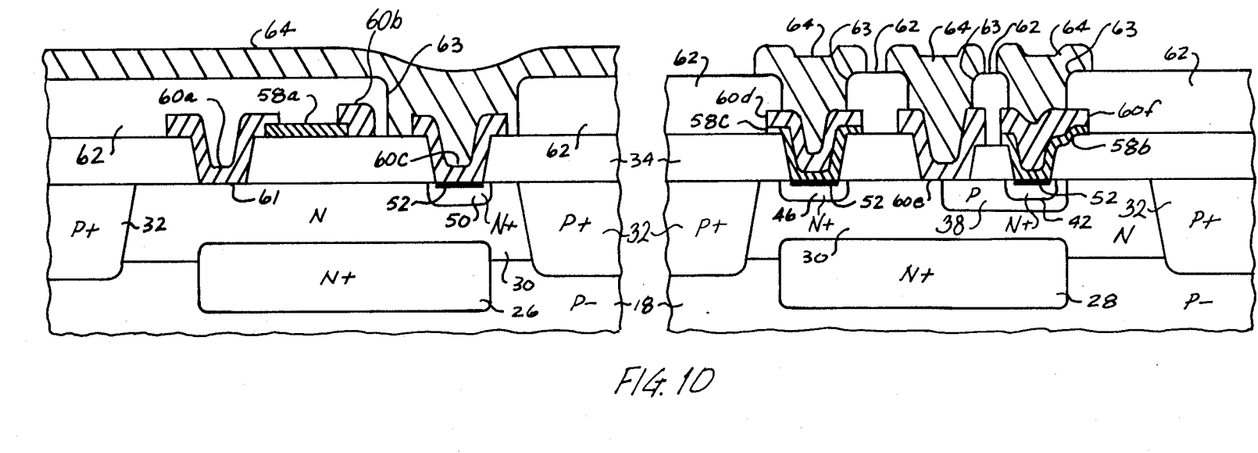

The bottom aluminum contact 60a forms a Schottky barrier contact with the epitaxial layer 30 at the region 61, thereby forming the anode contact for the Schottky diode of the memory element. The bottom aluminum contact 60c forms the cathode contact for the Schottky barrier diode of the memory element. The buried N+ layer 26 provides a low resistance path for the cathode side of the Schottky diode running through the semiconductor region between the two contacts 60a and 60c. The Schottkky barrier contact between the aluminum contact 60e and the epitaxial layer 30 provides a Schottky barrier clamping diode connected between the base region 38 and the collector region 30 of the transistor by way of the short-circuited surface junction of the base and collector.

Figure 11:
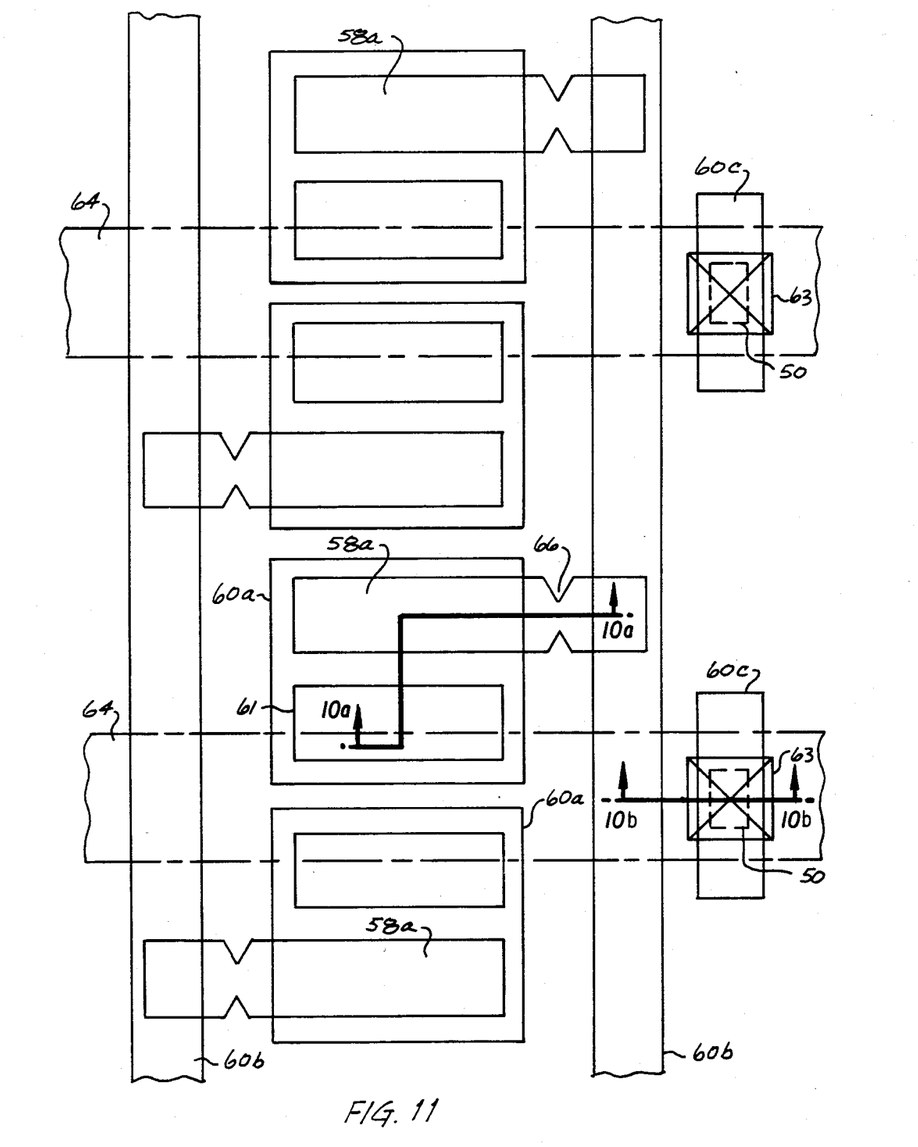
FIG. 11 is a plan view of the finished memory array structure according to the invention.

FIG. 11 generally shows a plan view of the left-hand structure of FIG. 10. In particular, the left-hand portion of the left-hand structure is generally taken through jagged section 10a—10a in FIG. 11. The right-hand portion of the left hand structure is generally taken through section 10b—10b in FIG. 11. The dimensions differ between FIGS. 10 and 11.

The fuse link 58a shown in FIG. 11 has a rectangular shape in plan view and preferably has a notch 66 to reduce its width and thereby reduce the fuse-blowing current. Other well known shapes may also be used for the fuse links 58a.

It will now become apparent that the use of titanium-tungsten-nitride as a single metallic film to provide the dual function of a fuse link and a diffusion barrier metal in the same semiconductor chip provides reduced manufacturing complexity, with resulting cost reduction. These manufacturing efficiencies can be especially important for large scale memories where shallow emitter diffusions are encountered.

While the invention has been illustrated and described as embodied in a memory array, the use of titanium-tungsten-nitride films in accordance with the teachings of the invention can be used in other types of programmable chips such as programmable gate arrays and logic arrays and in such applications as redundancy in random access memories. Furthermore, although illustrated in a junction isolated structure, the titanium-tungsten-nitride films can also be used to similar advantage in other types of isolated structures, such as those employing dielectric or oxide isolation.

What I claim is:

1. A semiconductor integrated circuit, comprising:
   (a) a semiconductor body having a surface and a layer of insulating material over said surface; and
   (b) a plurality of memory elements, each memory element including a semiconductive device within said body and a fusible link carried by said layer of insulating material and coupled in series with said semiconductive device, said fusible link being formed from titanium-tungsten-nitride.

2. The invention according to claim 1, wherein said fusible link comprises a film of titanium-tungsten-nitride about 600 angstroms thick.

3. The invention according to claim 1 wherein the resistivity of said film is about 270 micro-ohm-centimeters.

4. The invention according to claim 1 wherein said semiconductive device is a diode.

5. The invention according to claim 1, wherein said semiconductive device is a Schottky diode.

6. A semiconductor integrated circuit, comprising:
   (a) a semiconductor body having a surface and a layer of insulating material over said surface;
   (b) a matrix of rows and columns of conductors;
   (c) an array of memory elements, each memory element including a semiconductive device within said body and a fusible link carried by said layer of insulating material and connected in series with said semiconductive device between a row conductor and a column conductor;
   (d) at least one additional semiconductive device within said body not forming a part of said memory array, said additional semiconductor device including a region of said semiconductor body lying along said surface and extending below said surface; and
   (e) a plural metal layer structure in electrical contact with said region at said surface, one of said metal layers serving as a barrier layer between another of said metal layers superposed thereon and said region, both said one metal layer and said fusible link being formed from titanium-tungsten-nitride.

7. The invention according to claim 6 wherein said fusible link and barrier layer comprise a film of titanium-tungsten-nitride about 600 angstroms thick.

8. The invention according to claim 6 wherein the resistivity of said film is about 270 micro-ohm-centimeters.

9. The invention according to claim 6 wherein said semiconductive device is a Schottky diode.

10. The invention according to claim 6 wherein said additional semiconductive device is a bipolar transistor, and said one metal layer serves as the electrical contact to an emitter region of the bipolar transistor.

11. The invention according to claim 10 wherein said bipolar transistor has collector contact region and there is an additional plural metal layer structure in which the titanium-tungsten-nitride forms a barrier layer at said collector contact region.

* * * * *